(12) United States Patent
Kim

(10) Patent No.: US 6,898,255 B2
(45) Date of Patent: May 24, 2005

(54) FILTER COEFFICIENT GENERATOR

(75) Inventor: Sang Yeon Kim, Kyonggi-do (KR)

(73) Assignee: LG Electronics Inc., Seoul (KR)

(*) Notice: Subject to any disclaimer, the term of this patent is extended or adjusted under 35 U.S.C. 154(b) by 782 days.

(21) Appl. No.: 09/885,937

(22) Filed: Jun. 22, 2001

(65) Prior Publication Data

US 2002/0012390 A1 Jan. 31, 2002

(30) Foreign Application Priority Data

Jun. 22, 2000 (KR) .......................................... 2000-34559

(51) Int. Cl.$^7$ .............................................. H04B 1/10
(52) U.S. Cl. ........................ 375/350; 375/232; 708/313; 708/322
(58) Field of Search ................................ 375/142, 143, 375/150, 152, 232, 342, 350; 708/319, 322, 323, 422, 313

(56) References Cited

U.S. PATENT DOCUMENTS

| | | | | |
|---|---|---|---|---|
| 4,868,868 A | * | 9/1989 | Yazu et al. ................. 704/205 |
| 5,109,395 A | * | 4/1992 | Tanaka ........................ 377/144 |
| 5,933,452 A | * | 8/1999 | Eun ............................. 375/232 |
| 6,184,921 B1 | * | 2/2001 | Limberg ....................... 348/21 |

\* cited by examiner

*Primary Examiner*—Young T. Tse
*Assistant Examiner*—Sam K. Ahn
(74) *Attorney, Agent, or Firm*—Birch, Stewart, Kolasch & Birch, LLP

(57) ABSTRACT

An apparatus and method for generating finite impulse response (FIR) filter coefficients are presented. The apparatus includes an address generator that multiplies a desired cutoff frequency f by an integer n to generate an address, a first look-up table that generates a sine function value of the address, a divider that divides the sine function value by n*pi, a multiplexer that generates an impulse response function value by selecting one of a value produced from the divider and 2*f based on an outside control signal, and a multiplier that multiplies the impulse response function value by a corresponding window function value to generate an nth filter coefficient for the FIR filter.

20 Claims, 4 Drawing Sheets

FILTER COEFFICIENT GENERATOR

BACKGROUND OF THE INVENTION

1. Field of the Invention

The present invention relates to a filter coefficient generator, and more particularly, to a filter coefficient generator that promptly generates necessary filter coefficients in response to frequent sampling rate (frequency) changes of digital signals.

2. Background of the Related Art

Supporting various display modes (e.g., PIP, POP, Zoom-In, Zoom-Out, and etc.) and display formats have become essential factors for digital televisions of these days. Up/down sampling rate conversion techniques are often used when it is necessary to change image sizes in order to make proper changes to the various display modes/formats in the digital televisions.

FIGS. 1 and 2 show general up/down sampling rate conversion techniques widely used to make such changes.

FIG. 1A illustrates a 1:M up sampling process of a digital signal when M is equal to 3. After M-1 zero-stuffing step is performed, wherein M-1 zero-valued samples are added, the signal passes through a low-pass filter having its cutoff frequency equal to 0.5/M.

FIG. 1B illustrates a N:1 down sampling process of a digital signal when N is equal to 3. It consists of a low-pass filter having its cutoff frequency of 0.5/N and a decimator. The purpose of the low-pass filter is to prevent aliasing.

However, many practical applications require not only a simple 1:M or N:1 sampling rate conversion, but rather a general M:N rate conversion. Since the sampling locations of input and output data are different, and the up or down sampling step needs to be performed depending on the values of M and N, a M:N decimator is combined with a liner interpolator forming a general format converter (GFC). FIG. 2 illustrates the structure of a GFC, and an example of a 3:2 down sampling process. As shown in FIG.2, the sampling locations of input and output data are not identical. The output data are calculated by interpolating two adjacent input samples (or data).

A digital filter is an essential component in the process of changing display modes or image formats having various sizes, and the coefficients of the filter must be changed depending on the sizes of input and output data. Therefore, digital televisions, wherein the output sizes and display modes are frequently changed, require an automatic filter coefficient generator. Filter coefficient generators according to the prior art, however, are not able to timely generate filter coefficients necessary for the changes such as display modes and image formats. Therefore, the image quality may be impaired in a transition period.

SUMMARY OF THE INVENTION

Accordingly, the present invention is directed to a filter coefficient generator that substantially obviates one or more problems due to limitations and disadvantages of the related art.

An object of the present invention is to provide a filter coefficient generator that timely generates filter coefficients necessary for frequent display mode and image format change.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for generating finite impulse response (FIR) filter coefficients includes an address generator that multiplies a desired cutoff frequency $f_i$ by an integer n representing coefficient tap position to generate an address, a first look-up table that generates a sine function value of the address; a divider that divides the sine function value by $n\pi$, a multiplexer that generates an impulse response function value by selecting one of a value produced in the divider and $2f_i$ based on an outside control signal, and a multiplier that multiplies the impulse response function value by a corresponding window function value to generate a filter coefficient at nth tap position.

In another aspect of the present invention, an apparatus for generating high-pass or band-pass FIR filter coefficients using more than one low-pass filter coefficient generating devices having different desired cutoff frequencies is disclosed. The apparatus includes at least two low-pass filter coefficient generating devices each of which is shown as a first embodiment of the present invention; and an adder coupled to the devices for generating an nth high-pass or band-pass filter coefficient by adding or subtracting each of nth low-pass filter coefficients generated by each device.

In another aspect of the present invention, a method for generating finite impulse response (FIR) filter coefficients includes generating an address by multiplying a desired cutoff frequency $f_i$ by an integer n, generating a sine function value of the address; dividing the sine function value by $n\pi$, generating an impulse response function value by selecting one of a first value produced from the division and $2f_i$ based on an outside control signal, and generating an nth filter coefficient value by multiplying the impulse function value by a corresponding window function value.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Filters used for sampling rate conversion caused by display mode and image format changes generally require low-pass characteristics, and the values of filter coefficients must be promptly updated based on the rates of input and output data. However, the present invention is nonly limited only to low-pass filters, but rather involves general filters that include any one of low-pass, high-pass, and band-pass characteristics.

Figure 1A:
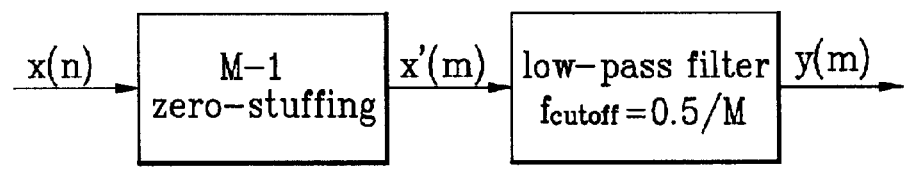
FIG. 1A illustrates a 1:M up sampling process of a digital signal.
Figure 1A:
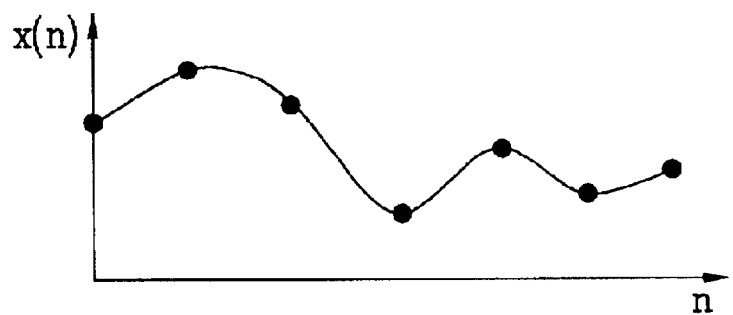
Figure 1A:
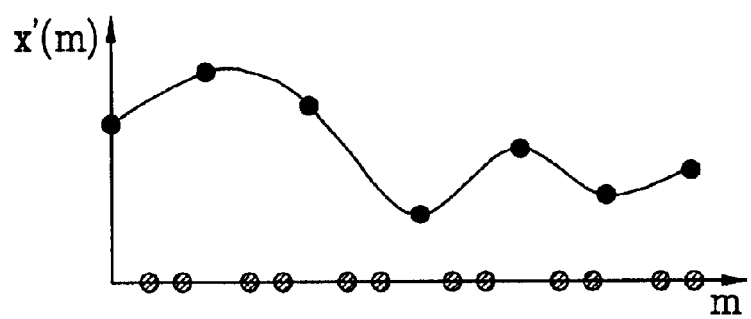
Figure 1A:
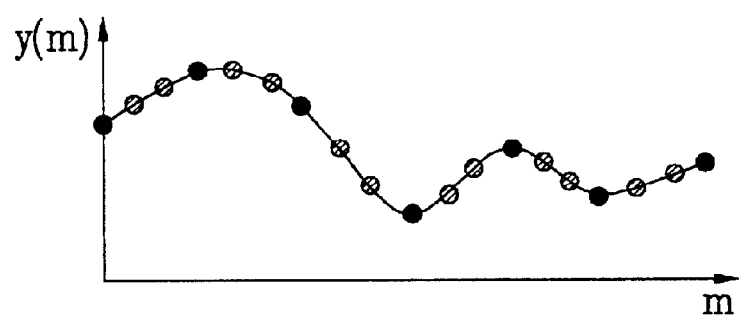
Figure 1B:
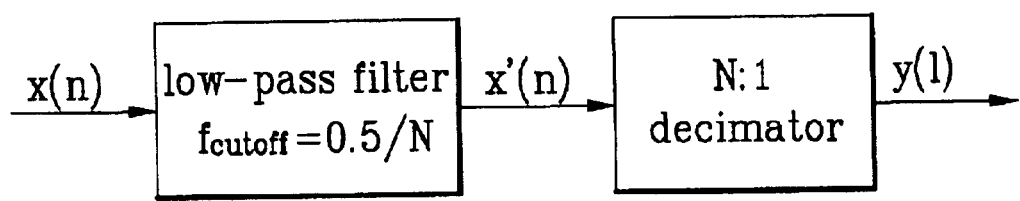
FIG. 1B illustrates a N:1 down sampling process of a digital signal.
Figure 1B:
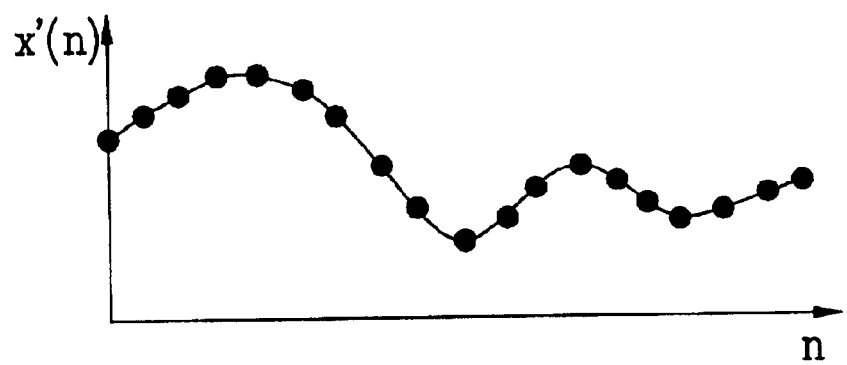
Figure 1B:
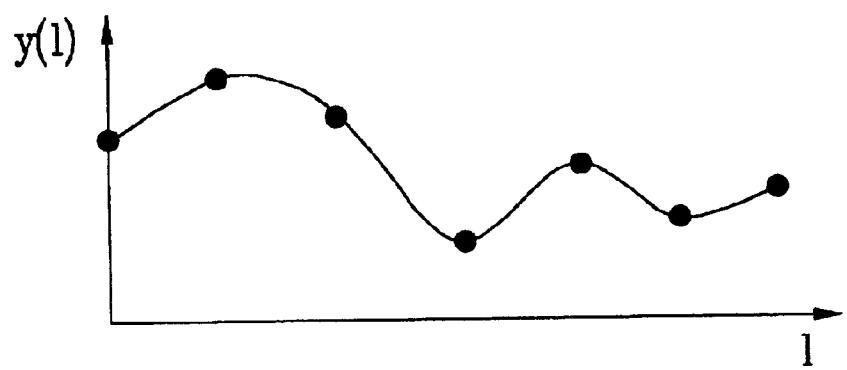
Figure 2:
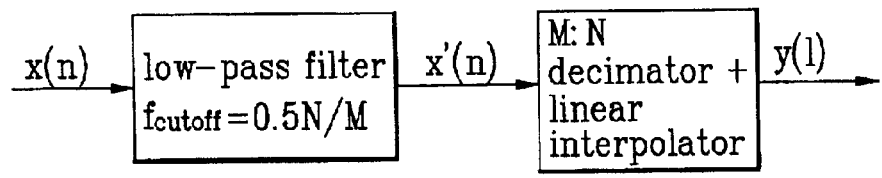
FIG. 2 illustrates the structure of a GFC and an example of a 3:2 down sampling process.
Figure 2:
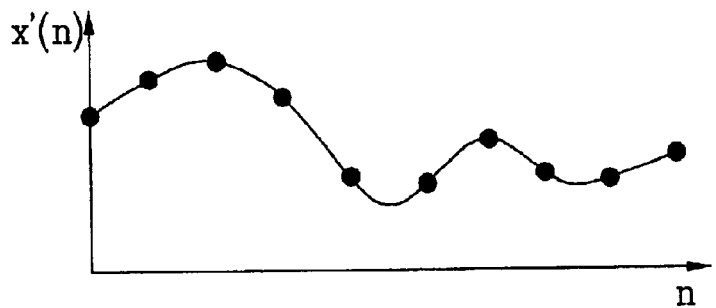
Figure 2:
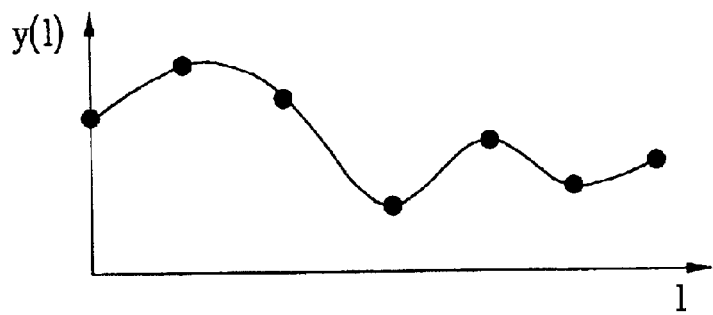
Figure 3:
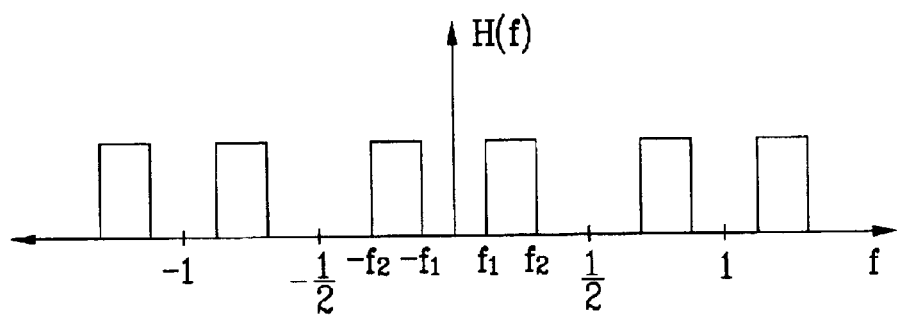
FIG. 3 illustrates the magnitude function of a filter having f1 and f2 as its low and high cutoff frequencies.

FIG. 3 illustrates the magnitude function of a filter having f1 and f2 as its low and high cutoff frequencies. The impulse response of the filter can be obtained by using an inverse Fourier transformation as follows. [Eq.1]

$$h(n) = F^{-1}\{H(f)\} = \int_{-f_2}^{f_2} e^{j2\pi fn} df - \int_{-f_1}^{f_1} e^{j2\pi fn} df$$
$$= 2f_2 \operatorname{sinc}(2\pi f_2 n) - 2f_1 \operatorname{sinc}(2\pi f_1 n)$$
$$= \frac{\sin(2\pi f_2 n)}{\pi n} - \frac{\sin(2\pi f_1 n)}{\pi n}$$

where $F^{-1}\{*\}$ denotes an inverse Fourier transformation operator.

Eq.1 is a general equation that can be applied to all of band-pass, high-pass, and low-pass filters. In other words, if it needs to have a low-pass characteristic, f1 and f2 are set to 0 and a desired cutoff frequency, respectively. Similarly, f1, and f2 can be set to a desired cutoff frequency and 0.5, respectively, in order to have high-pass filter characteristics.

In a windowing method, which is widely used to get finite impulse response (FIR) function, a limited number of filter coefficients are obtained by multiplying the impulse response function values by a limited number of window function values as follows:

$$g(n) = h(n) * w\left(n + \frac{N-1}{2}\right)$$

where N represents the number of filter taps which is generally deemed equal to the number of FIR filter coefficients.

Some commonly used windows are defined as follows:

(a) Rectangular window $$w(n) = \begin{cases} 1, & 0 \le n \le N-1 \\ 0, & \text{otherwise} \end{cases}$$

(b) Bartlett window $$w(n) = \begin{cases} \frac{2n}{N-1}, & 0 \le n \le \frac{N-1}{2} \\ 2 - \frac{2n}{N-1}, & \frac{N-1}{2} \le n \le N-1 \\ 0, & \text{otherwise} \end{cases}$$

(c) Hanning window $$w(n) = \begin{cases} \frac{1}{2}\left(1 - \cos\left(\frac{2\pi n}{n-1}\right)\right), & 0 \le n \le N-1 \\ 0, & \text{otherwise} \end{cases}$$

(d) Hamming window $$w(n) = \begin{cases} 0.54 - 0.46\cos\left(\frac{2\pi n}{N-1}\right), & 0 \le n \le N-1 \\ 0, & \text{otherwise} \end{cases}$$

(e) Blackman window $$w(n) = \begin{cases} 0.42 - 0.5\cos\left(\frac{2\pi n}{N-1}\right) + 0.08\cos\left(\frac{4\pi n}{N-1}\right), & 0 \le n \le N-1 \\ 0, & \text{otherwise} \end{cases}$$

Since the window function has non-zero values when $0 \le n \le N-1$, the calculated filter coefficient has non-zero values when $$-\frac{N-1}{2} \le n \le \frac{N-1}{2}.$$

Figure 4:
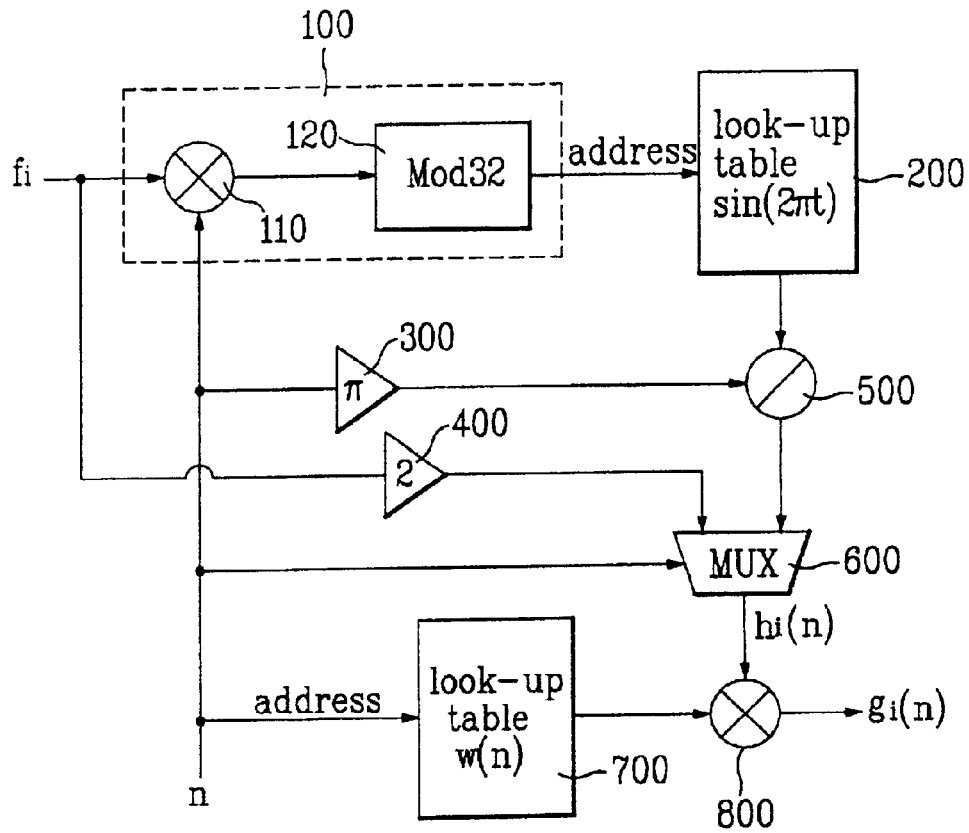
FIG. 4 illustrates a block diagram of an automatic filter coefficient generating apparatus according to the present invention.

FIG. 4 illustrates a block diagram of an automatic filter coefficient generating apparatus according to the present invention. First, an address generator (100) generates an address having its value in the range of 0 to 31 by multiplying a desired cutoff frequency ($f_i$) by n (110) and performing a modular by 32 operation (120) afterward. The value of n is greater than or equal to 0, and less than or equal to N−1. The value of $f_i$ is represented in binary numbers. Actual values of the cutoff frequencies and their corresponding values in binary numbers are shown in the table 1.

TABLE 1

| $f_1$ | Actual cutoff frequency |
| --- | --- |
| 0000 | 0/32 |
| 0001 | 1/32 |
| 0010 | 2/32 |
| 0011 | 3/32 |
| 0100 | 4/32 |
| 0101 | 5/32 |
| 0110 | 6/32 |
| 0111 | 7/32 |
| 1000 | 8/32 |
| 1001 | 9/32 |
| 1010 | 10/32 |
| 1011 | 11/32 |
| 1100 | 12/32 |
| 1101 | 13/32 |
| 1110 | 14/32 |
| 1111 | 15/32 |

Then a first look-up table (200) outputs the corresponding value of the sine function based on the address value received from the address generator. The look-up table (200) contains 32 sampled values representing a period of a sine function. In order to get more accurate values of the filter coefficients, the values of $f_i$ can be represented in more than 4 bits. Then output value from the look-up table (200) needs to be also increased. The output value from the look-up table (200) is then divided by $n\pi$ in a divider (500). One of the output value from the divider and $2f_i$ (400) is selected by a multiplexer (600) depending on a control signal from outside. For example, the multiplexer selects $2f_i$ if n is equal to 0, and otherwise it selects the output from the divider. Thereafter, a filter coefficient value, $g_i(n)$ can be finally obtained by multiplying the value selected by the multiplexer by a window function value (w(n)). The calculated coefficients consist of N taps, and the location of each tap is $$\left(-\frac{N-1}{2}, \ldots, \frac{N-1}{2}\right).$$

The values of w(n) are stored in a second look-up table (700) having its size equal to N. Additionally, a desired ripple size and transition bandwidth may be obtained by using any one of various windows shown in the earlier section.

Figure 5:
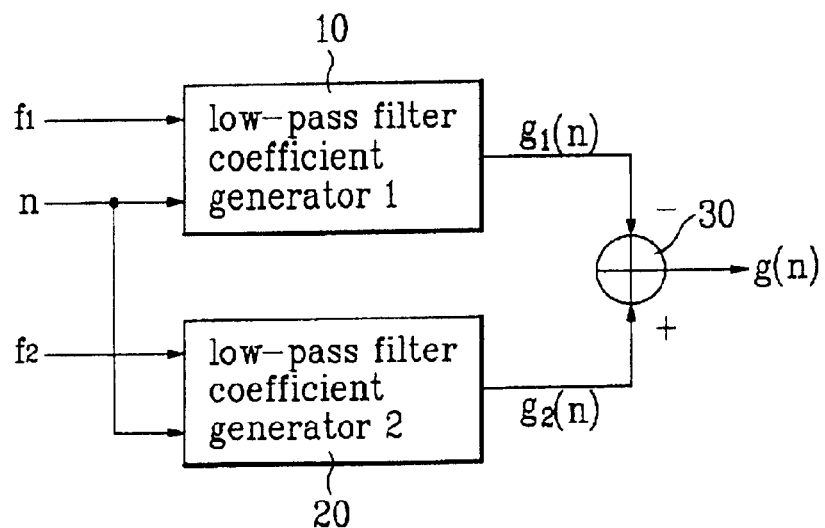

The FIG. 5 illustrates a low-pass/high-pass/band-pass filter coefficient generating apparatus. It consists of two low-pass filter coefficient generating devices having different cutoff frequencies. An adder (30) adds the output values from each device to obtain the low-pass or high-pass or band-pass filter coefficients.

As shown and explained above, the filter coefficient generating apparatus based on the present invention can promptly generates filter coefficients in response to the frequent image format and display mode changes.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus for generating finite impulse response (FIR) filter coefficients comprising:
    (a) an address generator that multiplies a desired cutoff frequency $f_i$ by an integer n based on an outside control signal to generate an address;
    (b) a first look-up table that generates a sine function value of said address;
    (c) a divider that divides said sine function value by $n\pi$;
    (d) a multiplexer that generates an impulse response function value by selecting one of a first value provided by said divider and $2f_i$ based on said outside control signal; and
    (e) a multiplier that multiplies said impulse response function value by a corresponding window function value to generate an nth filter coefficient value.

2. The apparatus of claim 1, wherein said multiplexer generates said impulse response function value by selecting said first value if n is equal to zero or by selecting $2f_i$ if n is not equal to zero.

3. The apparatus of claim 1, wherein n=0, 1, 2, ..., N–1 where N represent a number of said FIR filter coefficients.

4. The apparatus of claim 1, wherein said nth filter coefficient value can be non-zero only when $$-\frac{N-1}{2} \leq n \leq \frac{N-1}{2},$$

where N represents a number of said FIR filter coefficients.

5. The apparatus of claim 1, wherein said corresponding window function value is obtained by using any one of Rectangular, Bartlett, Hanning, Hamming, and Blackman window functions.

6. The apparatus of claim 1, further comprising a second look-up table that receives the integer n and generates said corresponding window function value.

7. An apparatus for generating low-pass or high pass or band-pass FIR filter coefficients using more than one low-pass filter coefficient generating devices having different desired cutoff frequencies, the apparatus comprising:
    (a) at least two low-pass filter coefficient generating devices, each of said devices comprises
        (a1) an address generator that multiplies a desired cutoff frequency $f_i$ by an integer n based on an outside control signal to generate an address,
        (a2) a first look-up table that generates a sine function value of said address,
        (a3) a divider that divides said sine function value by $n\pi$,
        (a4) a multiplexer that generates an impulse response function value by selecting one of a first value produced by said divider and $2f_i$ based on an said outside control signal, and
        (a5) a multiplier that multiples said impulse response function value by a corresponding window function value to generate an nth low-pass filter coefficient value; and
    (b) an adder coupled to said devices for generating an nth low pass, high-pass or band pass filter coefficient value by adding each of said nth low-pass, high-pass or band-pass filter coefficient values generated by said devices in the step (a5).

8. The apparatus of claim 7, wherein said multiplexer generates said impulse response function value by selecting said first value if n is equal to zero or by selecting $2f_i$ if n is not equal to zero.

9. The apparatus of claim 7, wherein n=0, 1, 2, ..., N–1, where N represents a number of said FIR filter coefficients.

10. The apparatus of claim 7, wherein said nth filter coefficient value generated in the step (b) can be nonzero only when $$-\frac{N-1}{2} \leq n \leq \frac{N-1}{2},$$

where N represents a number of said FIR filter coefficients.

11. The apparatus of claim 7, wherein said corresponding window function value is obtained by using any one of Rectangular, Bartlett, Hanning, Hamming and Blackman window functions.

12. The apparatus of claim 7, wherein each of said devices further comprises a second look-up table that receives the integer n and generates said corresponding window function value.

13. A method for generating finite impulse response (FIR) filter coefficients, the method comprising,
    (a) generating art address by multiplying a desired cutoff frequency $f_i$ by an integer n based on an outside control signal;
    (b) generating a sine function value of said address;
    (c) dividing said sine function value by $n\pi$;
    (d) generating an impulse response function value by selecting one of a first value produced from said division in the step (c) and $2f_i$ based on said outside control signal; and
    (e) generating an nth filter coefficient value by multiplying said impulse response function value by a corresponding window function value.

14. The method of claim 13, wherein said impulse response function value is generated by selecting said first value if n is equal to zero or by selecting $2f_i$ if n is not equal to zero.

15. The method of claim 13, wherein n=0, 1,2, ..., N−1, where N represents a number of said FIR filter coefficients.

16. The method of claim 15, wherein the number of said FIR filter coefficients is determined by a number of taps.

17. The method of claim 13, wherein said nth filter coefficient value can be non-zero only when $$-\frac{N-1}{2} \leq n \leq \frac{N-1}{2},$$

where N represent a number of said FIR filter coefficients.

18. The method of claim 17, wherein the number of said FIR filter coefficients is determined by a number of taps.

19. The method of claim 13, wherein said corresponding window function value is obtained by using any one of Rectangular, Bartlett, Hanning, Hamming, and Blackman window functions.

20. The method of claim 13, wherein said corresponding window function value is a (n+(N−1)/2)th window function value, wherein N represents the number of filter coefficients.

* * * * *